United States Patent
Nam et al.

(10) Patent No.: US 12,035,516 B2
(45) Date of Patent: Jul. 9, 2024

(54) ELECTROMAGNETIC INTERFERENCE SHIELDING COMPOSITE AND ELECTRONIC DEVICE INCLUDING THE SAME

(71) Applicant: Research & Business Foundation Sungkyunkwan University, Suwon-si (KR)

(72) Inventors: Jae Do Nam, Seoul (KR); Ui Seok Hwang, Seoul (KR); Na Yeon Kim, Seoul (KR); In Kyung Park, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 372 days.

(21) Appl. No.: 17/469,930

(22) Filed: Sep. 9, 2021

(65) Prior Publication Data
US 2022/0225550 A1 Jul. 14, 2022

(30) Foreign Application Priority Data
Jan. 13, 2021 (KR) .................. 10-2021-0004796

(51) Int. Cl.
*H05K 9/00* (2006.01)
*H05K 1/03* (2006.01)

(52) U.S. Cl.
CPC .......... *H05K 9/0081* (2013.01); *H05K 1/036* (2013.01); *H05K 9/0075* (2013.01); *H05K 2201/086* (2013.01)

(58) Field of Classification Search
CPC .. H05K 9/0075; H05K 9/0081; H05K 9/0083; H05K 1/036; H05K 2201/086; H01Q 17/007; H01Q 17/008
USPC ........................................... 361/818
See application file for complete search history.

(56) References Cited

U.S. PATENT DOCUMENTS

| | | | | |
|---|---|---|---|---|
| 9,974,215 | B1* | 5/2018 | Jeong | H05K 9/0088 |
| 2005/0045358 | A1* | 3/2005 | Arnold | H05K 9/003 |
| | | | | 174/51 |
| 2007/0041072 | A1* | 2/2007 | Yen | H05K 9/0088 |
| | | | | 359/244 |
| 2010/0059243 | A1* | 3/2010 | Chang | H05K 9/009 |
| | | | | 174/36 |
| 2016/0037692 | A1* | 2/2016 | Zhang | H05K 1/023 |
| | | | | 174/394 |

(Continued)

FOREIGN PATENT DOCUMENTS

| EP | 1 758 442 A1 | 2/2007 |
|---|---|---|
| JP | 2012-502479 A | 1/2012 |

(Continued)

*Primary Examiner* — Zhengfu J Feng
(74) *Attorney, Agent, or Firm* — NSIP Law

(57) ABSTRACT

Disclosed are an electromagnetic interference shielding composite that selectively absorbs and shields an electromagnetic wave, and an electronic device using the same. The electromagnetic interference shielding composite includes a first composite layer, wherein the first composite layer includes: a matrix; and reflective particles and absorbent particles dispersed in the matrix, wherein the reflective particles reflect an electromagnetic wave, wherein the absorbent particles absorb the electromagnetic wave and convert the absorbed electromagnetic wave to heat energy and emit the heat energy.

17 Claims, 5 Drawing Sheets

(56) References Cited

U.S. PATENT DOCUMENTS

2021/0111130 A1* 4/2021 Tanishita ............ H01L 23/3733

FOREIGN PATENT DOCUMENTS

| KR | 10-2008-0105546 A | 12/2008 |
| KR | 10-2010-0028365 A | 3/2010 |
| KR | 10-2013-0125098 A | 11/2013 |
| KR | 10-2018-0062790 A | 6/2018 |

* cited by examiner

[FIG. 1]
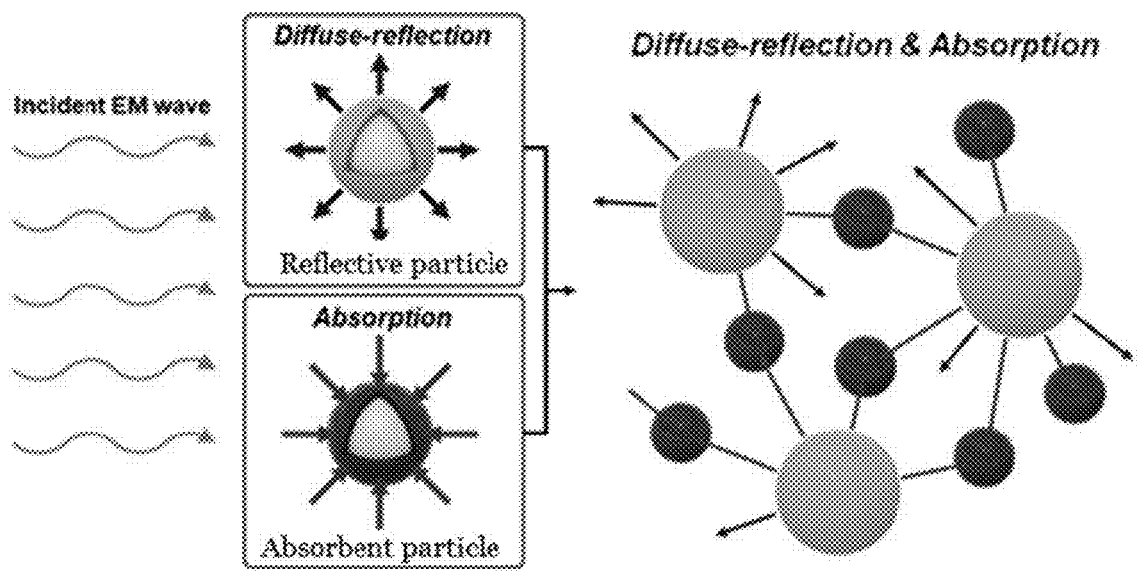
[FIG. 2A]
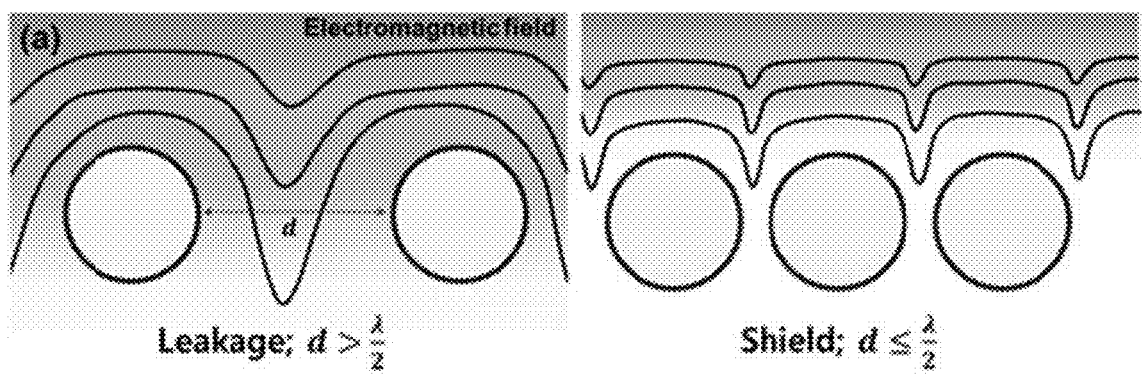

[FIG. 2B]
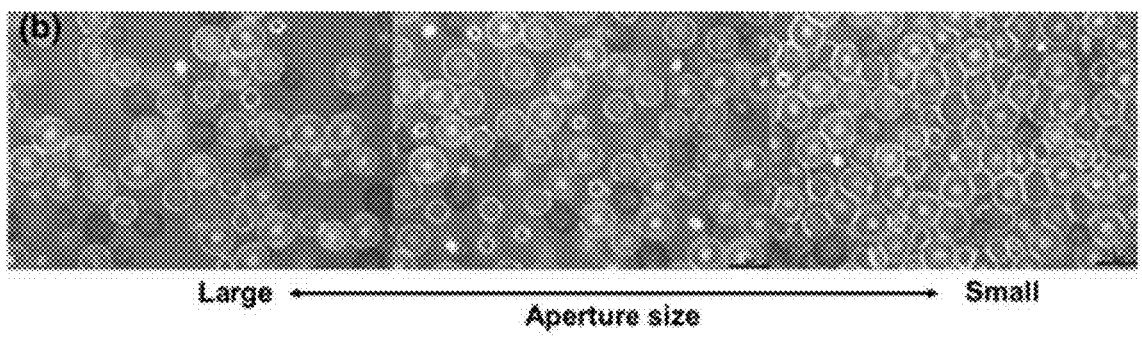
[FIG. 3]
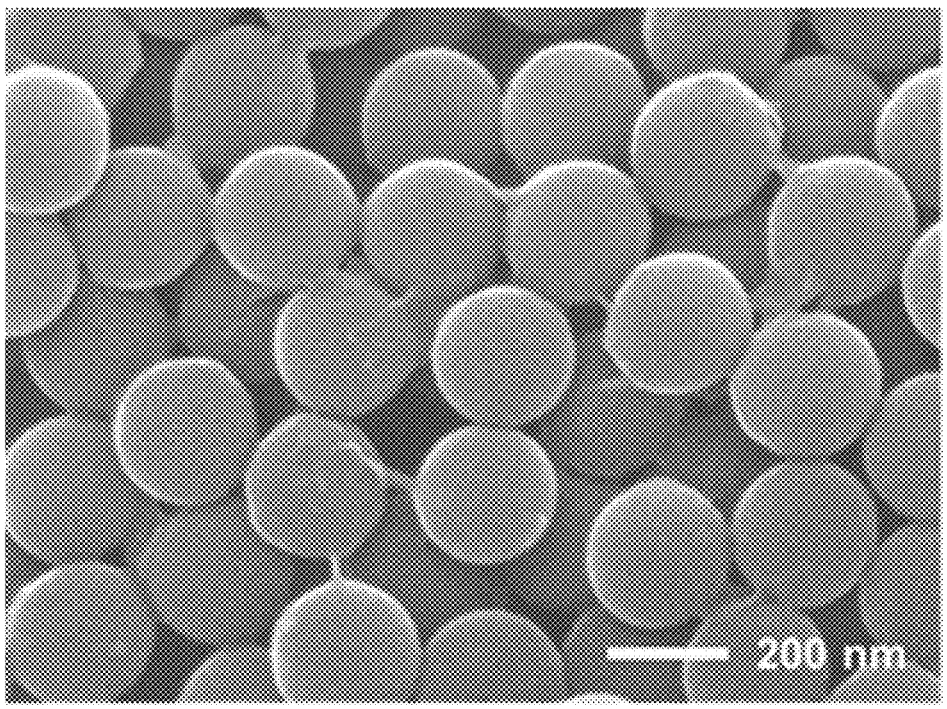

[FIG. 4]
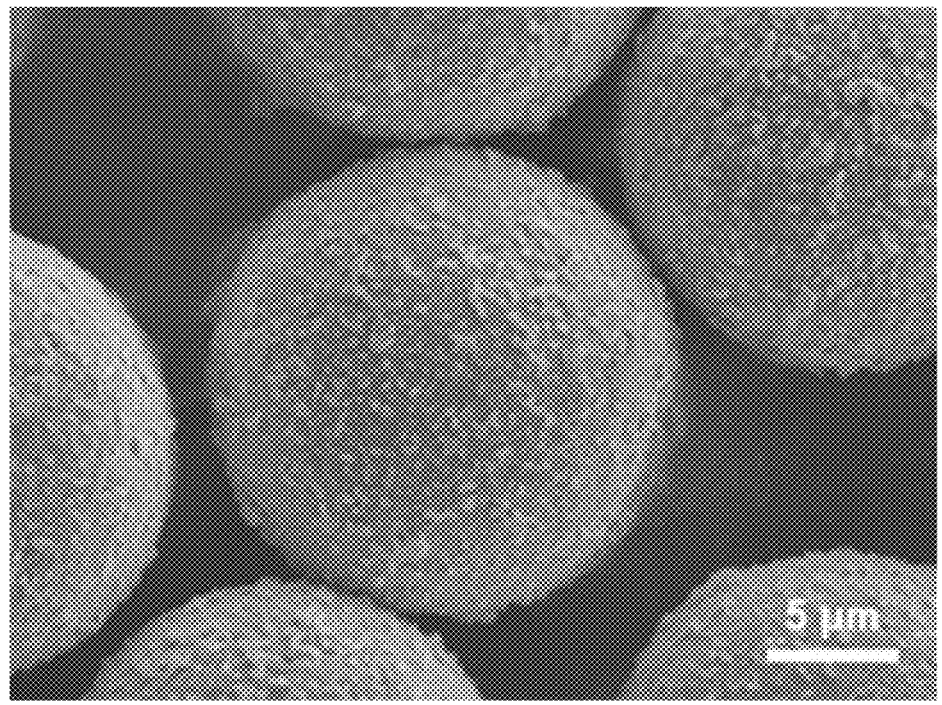
[FIG. 5]
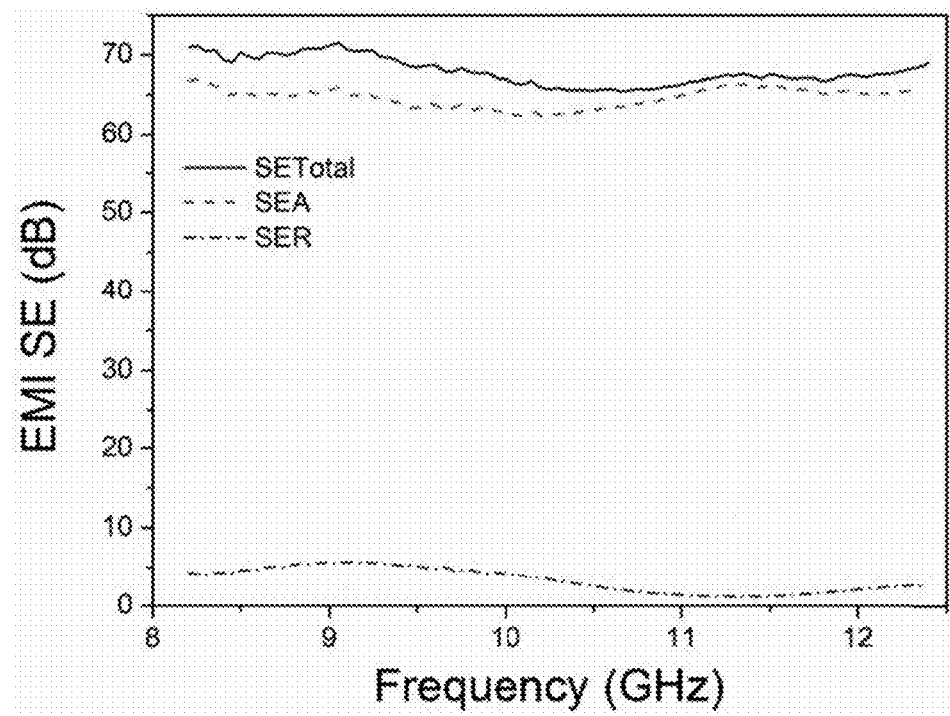

[FIG. 6]
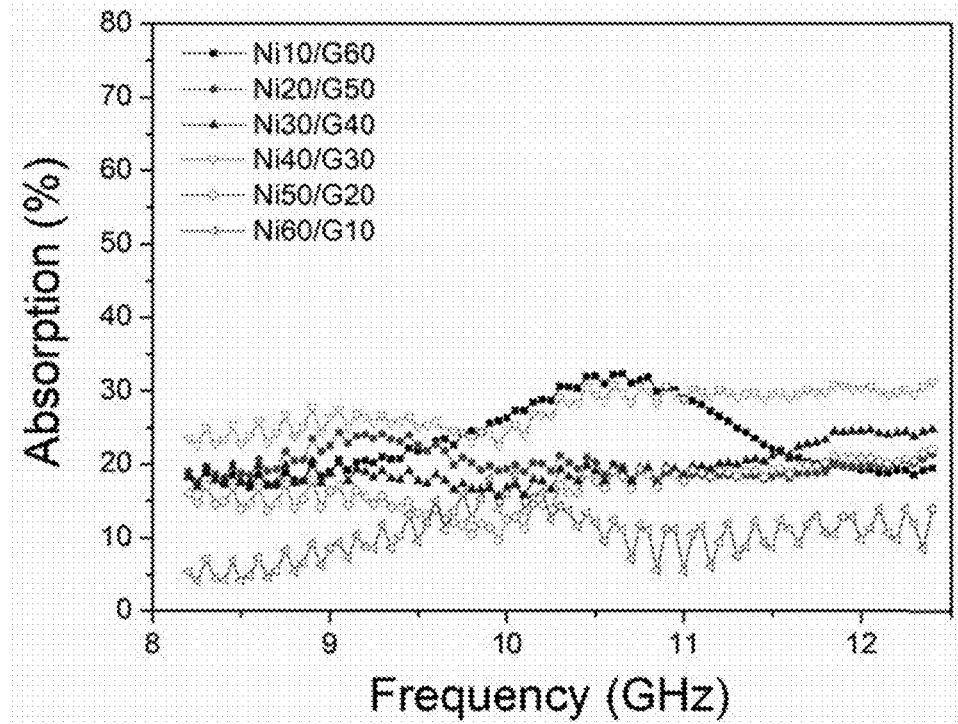
[FIG. 7]
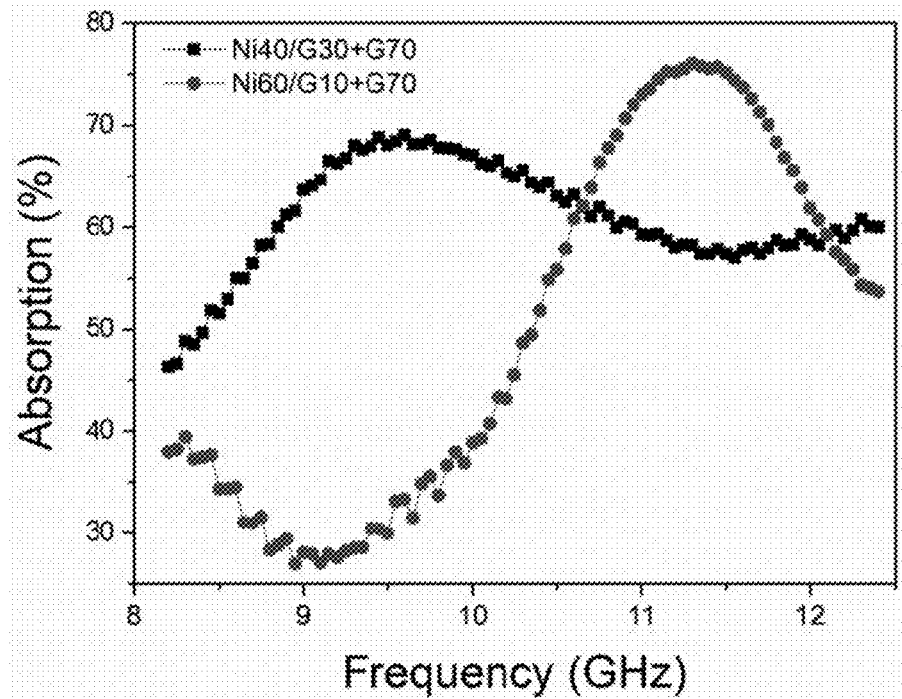

[FIG. 8]
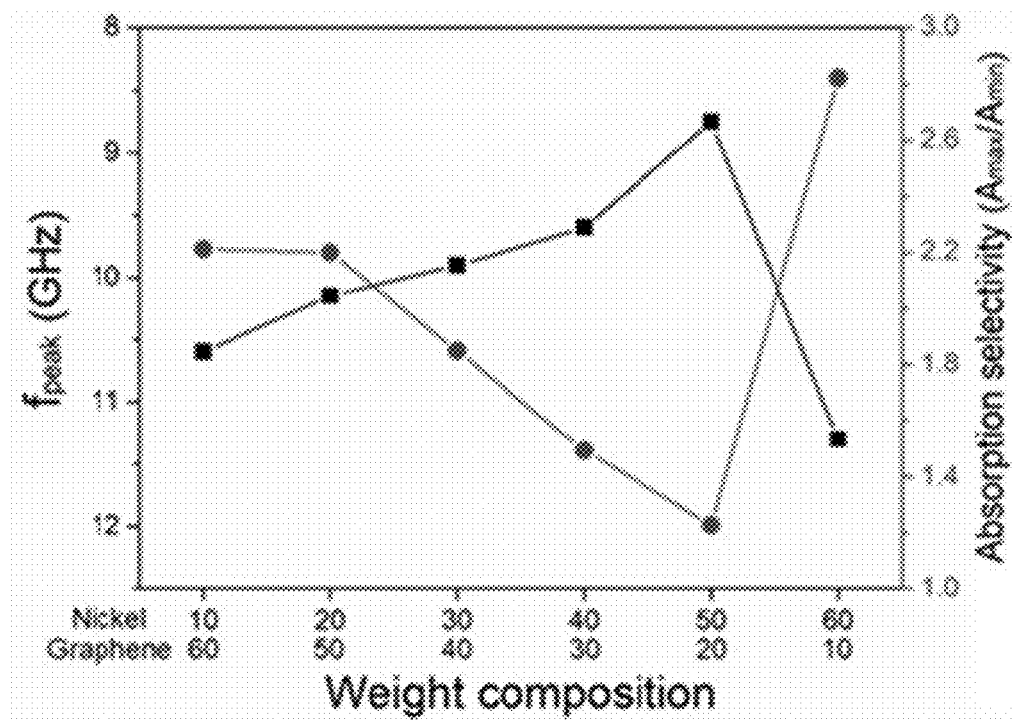
[FIG. 9]
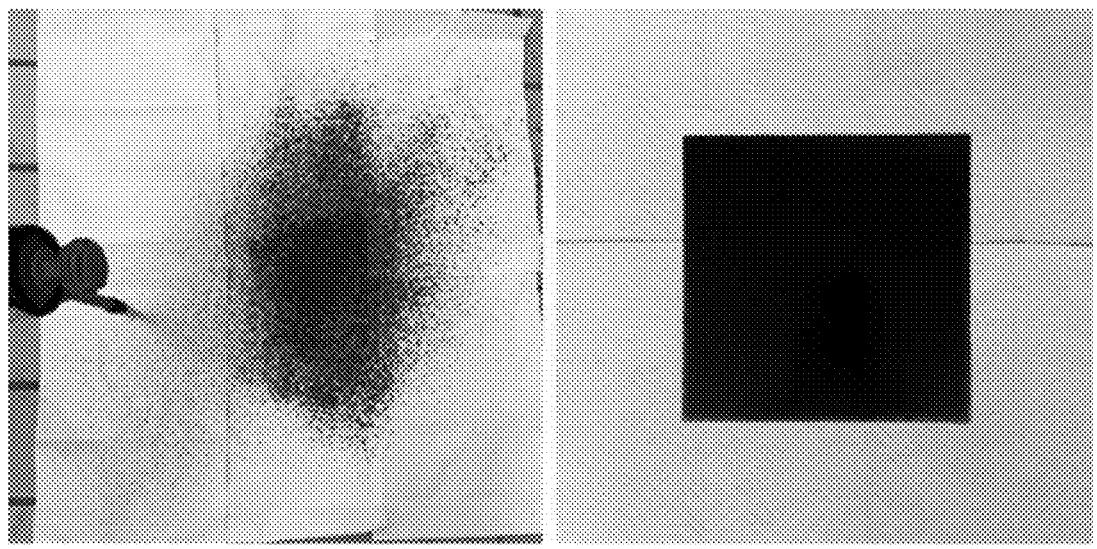

ELECTROMAGNETIC INTERFERENCE SHIELDING COMPOSITE AND ELECTRONIC DEVICE INCLUDING THE SAME

CROSS-REFERENCE TO RELATED APPLICATION

This application claims a benefit under 35 U.S.C. § 119(a) of Korean Patent Application No. 10-2021-0004796 filed on Jan. 13, 2021, on the Korean Intellectual Property Office, the entire disclosure of which is incorporated herein by reference for all purposes.

BACKGROUND

Field

The present disclosure relates to an electromagnetic interference shielding composite and an electronic device including the same, and more specifically, to an electromagnetic interference shielding composite that selectively absorbs and shields incident electromagnetic waves in a specific frequency range, and an electronic device using the same.

Description of Related Art

Recently, as the 5G communication era has emerged, electromagnetic waves in various frequency ranges are being used for telecommunication, exponentially increasing their usage. Thus, electromagnetic pollution originated from excessive electromagnetic waves is not only one of the main causes of malfunctions of peripheral equipment and various electronic devices, is but also harmful to the human body. Typically, a metal coating has been applied to internal parts of the device for electromagnetic interference (EMI) shielding. However, in this scheme, electromagnetic interference shielding is achieved by reflecting the electromagnetic waves. Thus, a secondary electromagnetic pollution occurs, resulting in a larger interference with more complicated patterns. Therefore, the electromagnetic interference shielding scheme to fundamentally remove the electromagnetic wave is required where the waves are shielded by absorption rather than reflection.

The electromagnetic wave may transmit through or may be shielded by a material depending on a frequency band thereof. For example, the material should selectively shield the waves in undesirable frequency ranges and transmit those in telecommunication frequency ranges, enabling for the vehicles to smoothly communicate without device malfunction. However, currently used electromagnetic interference shielding materials have only the ability to block the waves in all of the frequency bands. In other words, since the shielding performance thereof is not dependent on the frequency band, no material with frequency selective absorbent ability has been developed.

The demand of electronic parts for the vehicle is increasing along with the convenience of automobiles, the trend of high-end automobiles, and the development of hybrid automobiles. Accordingly, the need for electromagnetic interference shielding is also increasing. In particular, a detection system that determines the presence or absence of an object using a civilian radar continues to increase, which is applied to an autonomous driving system such as active cruise control, intelligent cruise control, blind spot detection, and a parking assistance system. The radar for vehicles uses millimeter waves, and its frequency band is set to 76 to 77 GHz in Korea. The electromagnetic waves in various frequency ranges are generated from different sources: those in 10 Hz to 400 kHz region are generated from various electronic devices and the automobiles, while the frequency range of 800 MHz to tens of GHz is typically popular for telecommunication applications. When these electromagnetic waves interfere with the sensing system, they act as a critical threat to the safety of drivers and pedestrians. Therefore, if a material with frequency selective absorption capability is applied to a vehicle, where the electromagnetic waves in the external frequency region are selectively absorbed, safety and detection accuracy may be dramatically improved opening a new era of advanced electromagnetic interference shielding materials.

Further, a stealth systems in military applications is currently one of the important issues. In order that an stealth aircraft is not to be detected by enemy radar, it should be equipped with the electromagnetic wave absorbent material (Radar Absorbing Material (RAM)) absorbing the so-called X-band region (8 to 12 GHz) wave which is applied to a surface of the body of the aircraft. At the same time, in order for the stealth fighter to communicate with an external site or fighter smoothly during a mission, the electromagnetic waves in the communication frequency region may transmit the RAM. Currently, a frequency selective surface (FSS) is applied to the communication radar antenna: it transmits the electromagnetic waves in specific frequency band for telecommunication and reflects those in other frequency bands to random directions. However, the FSS has a very narrow width of the frequency band for shielding. Further, the FSS is not a material that fundamentally removes electromagnetic waves. Thus, the electromagnetic wave is reflected therefrom depending on a flight angle of the aircraft and can be subsequently returned to the enemy radar, making it difficult for the FSS to fully exhibit the stealth function. Therefore, the 'frequency selective absorption' rather than the 'frequency selective reflection' may make it difficult for the stealth aircraft to be detected by the enemy radar and thus may dramatically increase the stealth function.

In order to solve the above-mentioned problems of the existing electromagnetic interference shielding materials, the existing shielding scheme that simply changes the travel path of the electromagnetic wave via reflection must be changed to a new shielding scheme that ultimately removes the electromagnetic wave via absorption. Thus, rapid advances in technology are expected based on the ability to selectively absorb electromagnetic waves based on the frequency bands.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide an electromagnetic interference shielding composite capable of reflecting and absorbing an electromagnetic wave having a specific wavelength and thus selectively shielding the electromagnetic wave.

Another purpose of the present disclosure is to provide an electronic device including the electromagnetic interference shielding composite.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

A first aspect of the present disclosure provides an electromagnetic interference shielding composite comprising a first composite layer, wherein the first composite layer includes: a matrix; and reflective particles and absorbent particles dispersed in the matrix, wherein the reflective particles reflect an electromagnetic wave, wherein the absorbent particles absorb the electromagnetic wave and convert the absorbed electromagnetic wave to heat energy and emit the heat energy.

In one implementation of the first aspect, a ratio of weights of the absorbent particles and the reflective particles in the first composite layer is greater than 10:0 and smaller than or equal to 1:9.

In one implementation of the first aspect, the reflective particle includes at least one selected from a group consisting of aluminum, copper, gold, silver, nickel, and MXene.

In one implementation of the first aspect, the absorbent particle includes one selected from a carbon-based material and a ferrite-based material.

In one implementation of the first aspect, the carbon-based material includes one selected from a group consisting of graphene, carbon nanotube, carbon fiber, carbon black, and graphite.

In one implementation of the first aspect, the ferrite ferrite-based material includes one selected from a group consisting of manganese ferrite, nickel-zinc ferrite, strontium ferrite, barium ferrite and cobalt ferrite.

In one implementation of the first aspect, a size of each of the absorbent particle and the reflective particle is in a range of 100 nm to 100 μm.

In one implementation of the first aspect, the absorbent particle has a core-shell structure including a polymer core particle and a shell layer covering the core particle and made of a carbon-based material or a ferrite-based material.

In one implementation of the first aspect, the reflective particle has a core-shell structure including a polymer core particle and a shell layer covering the core particle and made of one selected from a group consisting of aluminum, copper, gold, silver, nickel, and MXene.

In one implementation of the first aspect, a total content of the absorbent particles and the reflective particles in the matrix is in a range of 5 to 80 wt %.

A second aspect of the present disclosure provides an electromagnetic interference shielding composite comprising: a first composite layer and a second composite layer adjacent to the first composite layer, wherein the first composite layer includes: a first matrix; and reflective particles and first absorbent particles dispersed in the first matrix, wherein the reflective particles reflect an electromagnetic wave, wherein the first absorbent particles absorb the electromagnetic wave and convert the absorbed electromagnetic wave to heat energy and emit the heat energy; wherein the second composite layer includes: a second matrix; and second absorbent particles dispersed in the second matrix, wherein the second absorbent particles absorb an electromagnetic wave and convert the absorbed electromagnetic wave to heat energy and emit the heat energy.

In one implementation of the second aspect, the reflective particle includes at least one selected from a group consisting of aluminum, copper, gold, silver, nickel, and MXene.

In one implementation of the second aspect, each of the first and second absorbent particles includes one selected from a carbon-based material and a ferrite-based material.

In one implementation of the second aspect, a size of each of the first and second absorbent particles and the reflective particle is in a range of 100 nm to 100 μm.

In one implementation of the second aspect, each of the first and second absorbent particles has a core-shell structure including a polymer core particle and a shell layer covering the core particle and made of a carbon-based material or a ferrite-based material.

In one implementation of the second aspect, the reflective particle has a core-shell structure including a polymer core particle and a shell layer covering the core particle and made of one selected from a group consisting of aluminum, copper, gold, silver, nickel, and MXene.

A third aspect of the present disclosure provides an electronic device comprising: an electronic element; and an electromagnetic interference shielding composite covering a surface of the electronic element, wherein the electromagnetic interference shielding composite includes a first composite layer, wherein the first composite layer includes: a matrix; and reflective particles and absorbent particles dispersed in the matrix, wherein the reflective particles reflect an electromagnetic wave, wherein the absorbent particles absorb the electromagnetic wave and convert the absorbed electromagnetic wave to heat energy and emit the heat energy.

A fourth aspect of the present disclosure provides an electronic device comprising: an electronic element; and an electromagnetic interference shielding composite covering a surface of the electronic element, wherein the electromagnetic interference shielding composite includes: a first composite layer and a second composite layer adjacent to the first composite layer, wherein the first composite layer includes: a first matrix; and reflective particles and first absorbent particles dispersed in the first matrix, wherein the reflective particles reflect an electromagnetic wave, wherein the first absorbent particles absorb the electromagnetic wave and convert the absorbed electromagnetic wave to heat energy and emit the heat energy; wherein the second composite layer includes: a second matrix; and second absorbent particles dispersed in the second matrix, wherein the second absorbent particles absorb an electromagnetic wave and convert the absorbed electromagnetic wave to heat energy and emit the heat energy.

According to the present disclosure, unlike the prior art in which the electromagnetic wave of the specific wavelength is shielded by reflecting the electromagnetic wave of the specific wavelength, the electromagnetic interference shielding may be implemented by absorbing the electromagnetic wave of the specific wavelength, thereby solving the secondary electromagnetic wave pollution.

Further, the electromagnetic interference shielding efficiency and the frequency of the wave to be shielded may be controlled by adjusting the size and the shape of the electromagnetic wave absorbent and reflective particles within a desired range. In particular, in the 5G communication region (3.5 GHz and 28 GHz band: 3.42 to 3.70 GHz and 26.5 to 28.9 GHz, respectively), or the military radar frequency region (X-band: 8 to 12 GHz), the electromagnetic interference shielding may be adjusted more precisely by the composite according to the present disclosure. Thus, the composite according to the present disclosure may be applied to the 5G communication, automotive parts, and stealth aircraft in military applications, etc.

Moreover, the composite may be easily applied to the surface of parts in the assembly stage or to the finished products using processes such as compression, lamination, injection, etc. or a spray coating process as necessary. This may dramatically reduce the cost and may widen applications thereof.

Effects of the present disclosure are not limited to the above-mentioned effects, and other effects as not mentioned will be clearly understood by those skilled in the art from following descriptions.

BRIEF DESCRIPTION OF DRAWINGS

FIG. 1 is a diagram to illustrate an electromagnetic interference shielding composite according to the present disclosure.

FIGS. 2A-2B are diagrams illustrating an electromagnetic interference shielding process using the electromagnetic interference shielding composite according to the present disclosure based on an antenna theory.

FIG. 3 is an image taken with a scanning electron microscope (SEM) of an absorbent particle sample prepared according to Present Example 1 of the present disclosure.

FIG. 4 is an image taken with a scanning electron microscope (SEM) of a reflective particle sample used in Present Example 1 of the present disclosure.

FIG. 5 shows the result of measuring electromagnetic interference shielding effect of Ni60/G10 epoxy composite prepared according to Present Example 1 of the present disclosure in the X-band frequency. $SE_A$ means electromagnetic wave absorbing effectiveness and $SE_R$ means electromagnetic wave reflection effectiveness. $SE_{TOTAL} = SE_A + SE_R$ means total shielding effectiveness.

FIG. 6 shows the result of measuring the electromagnetic interference shielding effect of each of epoxy composites prepared according to Present Examples 1 to 6 of the present disclosure in the X-band frequency (8 to 12 GHz).

FIG. 7 shows the result of measuring the electromagnetic interference shielding effect of each of epoxy composites prepared according to Present Examples 8 to 10 of the present disclosure in the X-band frequency (8 to 12 GHz).

FIG. 8 shows the result of deriving the frequency $f_{peak}$ value mainly absorbed by each of double-layer epoxy composites prepared according to Present Examples 8 to 13 of the present disclosure, and an absorption selectivity parameter α thereof.

FIG. 9 is a diagram showing a producing process and a spray coating result of an electromagnetic wave absorbent coating solution of Present Example 14 of the present disclosure.

DETAILED DESCRIPTIONS

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, a term "reflective particle" refers to a particle that reflects 50% or greater of an electromagnetic wave incident on the particle.

As used herein, a term "absorbent particle" means a particle that absorbs 30% or greater of an electromagnetic wave incident on the particle.

FIG. 1 is a diagram to illustrate the electromagnetic interference shielding composite according to the present disclosure.

Referring to FIG. 1, the electromagnetic interference shielding composite according to the present disclosure may include a first composite layer composed of a matrix, and reflective particles and absorbent particles dispersed in the matrix, wherein the reflective particles reflect electromagnetic waves, wherein the absorbent particles absorb the electromagnetic waves and convert the absorbed electromagnetic waves to heat energy and emit the heat energy.

The reflective particle refers to a particle that reflects and diffuses by 50% or greater of an electromagnetic wave incident on the particle. The reflective particle may be made of a material having a high electrical conductivity of 10,000 S/m or more to reflect electromagnetic waves. Therefore, the reflective particle may be made of metal or MXene (10,600 S/cm) as a two-dimensional material. For example, the metal may include one selected from aluminum (377,000 S/cm), copper (598,000 S/cm), gold (426,000 S/cm), and silver (629,000 S/cm). The MXene may include one selected from TiC, $V_2C$, $Nb_2C$, $Mo_2CMo_2N$, $Ti_2N$, $(Ti_{2-y}Nb_y)C$, $(V_{2-y}Nb_y)C$, $(Ti_{2-y}V_y)C$, $W_{1.33}C$, $Nb_{1.33}C$, $Mo_{1.33}C$, $Mo_{1.33}Y_{0.67}C$, $Ti_3C_2$, $Ti_3CN$, $Zr_3C_2$, $Hf_3C_2$, $Ti_4N_3$, $Nb_4C_3$, $Ta_4C_3$, $V_4C_3$, $(Mo, V)_4C_3$, $Mo_4VC_4$, $Mo_2TiC_2$, $Cr_2TiC_2$, $Mo_2ScC_2$, and $Mo_2Ti_2C_3$. Preferably, the MXene may include one selected from $Ti_3C_2$ or $Ti_3CN$ which may easily perform the electromagnetic interference shielding.

In one implementation, the reflective particle may have a core-shell structure including a polymer core particle and a shell layer covering the core particle and made of one selected from a group consisting of aluminum, copper, gold, silver, nickel, and MXene.

The core particle may be made of a polymer or inorganic material. For example, the polymer may include a material selected from a group consisting of styrene based polymer, methacrylate based polymer, acrylate based polymer, vinyl based polymer, acrylonitrile based polymer, and combinations thereof. The inorganic material may include a material selected from a group consisting of silicon dioxide, cerium oxide, titanium dioxide, boron nitride and aluminum nitride. The core particle may be prepared using methods such as emulsion polymerization, emulsifier-free emulsion polymerization, dispersion polymerization, and bead polymerization, depending on a size of the particle. Preferably, a liquid phase synthesis method may be used to obtain spherical uniform inorganic particles. However, the present disclosure is not necessarily limited thereto. Commercially available polymer particles may be used as the core particles.

In one implementation, in the preparation of the reflective particles having the core-shell structure, a metal shell may be prepared on a surface of the core particle using a chemical reaction or an electric reaction. For example, the shell may be prepared using an electroplating method, a sputtering method, an electroless plating method, etc. Preferably, an electroless plating method capable of forming the metal shell having a uniform thickness on the surface of the core particle may be used.

In another example, when using MXene, the reflective particle has the two-dimensional planar structure similar to that of graphene. Thus, the core-shell particle may be prepared via electrostatic attraction. However, in accordance the present disclosure, the structure of the reflective particle is not limited to the core-shell structure. A particles prepared using metal powders may be used as the reflective particles.

As used herein, the absorbent particle means a particle that absorbs 30% or greater of the electromagnetic wave incident on the particle. The absorbent particle may convert the electromagnetic wave of the specific wavelength and the electromagnetic wave reflected from the reflective particle to thermal energy which is emitted. The absorbent particle may be made of a material that may cause high dielectric loss and magnetic loss. Therefore, the absorbent particle may be made of one selected from a carbon-based material, and a ferrite based material as a magnetic material having a high magnetic permeability. For example, the carbon-based material may include one selected from graphene, carbon nanotubes, carbon fibers, carbon black and graphite. The ferrite-based material may include one selected from a group consisting of manganese ferrite, nickel-zinc ferrite, strontium ferrite, barium ferrite, and cobalt ferrite.

In one implementation, the absorbent particle may have a core-shell structure including a polymer core and a shell layer covering the core particle and made of a carbon-based material or a ferrite based material. The core particle may be made of a polymer or inorganic material. For example, the polymer may include a material selected from a group consisting of styrene based polymer, methacrylate based polymer, acrylate based polymer, vinyl based polymer, acrylonitrile based polymer, and combinations thereof. The inorganic material may include a material selected from a group consisting of silicon dioxide, cerium oxide, titanium dioxide, boron nitride, and aluminum nitride. The core particle may be prepared using methods such as emulsion polymerization, emulsifier-free emulsion polymerization, dispersion polymerization, and bead polymerization, depending on the size of the particle. Preferably, a liquid phase synthesis method may be used to obtain spherical uniform inorganic particles. However, the present disclosure is not necessarily limited thereto. Commercially available polymer particles may be used as the core particles.

In one implementation, when the shell is made of a carbon-based material, the absorbent particle having the core-shell structure may be prepared using an electrostatic attracting force between the core particle and the carbon-based material constituting the shell layer having different surface charges in a solution having an appropriate pH. Specifically, first, after dispersing the core particles in the solution, the pH is appropriately controlled to prepare a core particle solution. Then, a carbon-based material solution is prepared by controlling a solution in which the carbon-based material is dispersed to the same pH. Then, while the core particle solution is stirred, the carbon-based material solution is slowly added thereto to prepare absorbent particles. For example, when graphene is used as a material for the shell, negatively charged graphene oxide may be formed on a surface of the positively charged core particle via electrostatic attraction such that the shell is formed on the core particle. Thereafter, via an additional reduction process, the core-graphene shell particles may be prepared.

The matrix refers to a material capable of dispersing the absorbent and reflective particles therein, and may mean a dispersant. The matrix may include a rubber material, a plastic material, or a paint material.

For example, the rubber material may include a natural or synthetic rubber selected from a group consisting of natural rubber (NR), butadiene rubber (BR), styrene butadiene rubber (SBR), acrylonitrile butadiene rubber (NBR), fluoro rubber (FKM), silicone rubber (VMQ), chloroprene rubber (CR), ethylene propylene diene rubber (EPDM), and isobutylene isoprene rubber (IIR).

The plastic material may include general plastic or engineering plastic selected from a group consisting of polyethylene (PE), polypropylene (PP), polystyrene (PS), polyethylene terephthalate (PET), polyamide (PA), polyester (PES), polyvinyl chloride (PVC), polyurethane (PU), polycarbonate (PC), polyvinylidene chloride (PVDC), acrylonitrile-butadiene-styrene (ABS), poly(oxymethylene) (POM), poly(phenylene sulfide) (PPS), poly(ether sulfone) (PES), poly(ether ether ketone) (PEEK), polyimide (PI), etc.

The matrix for the paint and the spray coating may include one selected from a group consisting of alcohols, ketones, acrylics, urethanes, epoxy, enamels, waterborne polyurethane, (WPU), and the like.

However, the present disclosure is not necessarily limited to these types. Any material that may disperse the absorbent and reflective particles therein may be used as the matrix.

In one implementation, a process of dispersing the absorbent and reflective particles in the matrix may generally be the same as a preparation process including adding a filler inside the material. For example, when dispersing the particles in the matrix of the rubber material, an internal mixer, roll mill, etc. may be used. When dispersing the particles in the matrix of the plastic material, an extruder, injection machine, or a press may be used. Further, when the absorbent and reflective particles are dispersed in an appropriate matrix and binder suitable for spraying, a spray coating process may be used.

The electromagnetic interference shielding composite may selectively shield the electromagnetic wave via repeated diffusion reflection and absorption of the electromagnetic wave using the reflective and absorbent particles.

The selective shielding of the electromagnetic wave may be controlled by varying a ratio of contents of the reflective and absorbent particles. That is, the electromagnetic interference shielding composite may selectively shield the electromagnetic wave of the specific frequency region under control of the ratio between the contents of the reflective and absorbent particles. In addition, controlling a size and a content of each of the reflective and absorbent particles may allow precisely and selectively shielding the electromagnetic wave of the specific frequency region.

The reflective and absorbent particles of the electromagnetic interference shielding composite may have various spacings between the particles depending on the sizes and contents thereof. These spacings may determine whether the composite shields the wave, based on the frequency of the electromagnetic wave. This should be described in detail with reference to FIGS. 2A-2B.

Referring to FIGS. 2A-2B, when a distance d between particles corresponds to a spacing that exceeds ½ of the electromagnetic wave wavelength, the electromagnetic wave transmits through the particles of the composite. When the distance d between the particles corresponds a spacing ½ or smaller of the electromagnetic wave wavelength, the electromagnetic wave may be shielded by the particles of the composite. For example, when the wavelength of the specific frequency electromagnetic wave is 600 nm, the electromagnetic wave may be shielded by the particles of the composite when the spacing d between the particles is smaller than or equal to 300 nm. When the spacing d between the particles exceeds 300 nm, the wave may transmit through the particles of the composite.

Further, the size of each of the absorbent and reflective particles is one of factors affecting the selective transmission and shielding of the electromagnetic wave. Thus, the size of each of the absorbent and reflective particles in accordance with the present disclosure may be in a range of 100 nm to 100 μm. Preferably, the absorbent and reflective particles may have a size of 200 nm to 20 μm. More preferably, the absorbent particle may have a size of 200 nm to 10 μm. The reflective particle may have a size of 5 μm to 20 μm. In one implementation of the present disclosure, 200 nm-sized absorbent particles and 20 μm-sized reflective particles may be used.

In one implementation, a ratio of weights of the absorbent and reflective particles may be greater than 10:0 and smaller than or equal to 1:9. When a ratio of weights of the absorbent and reflective particles is greater than 1:9, the frequency selective absorption may not be achieved.

In one example, in one implementation, a total content of the absorbent particle and the reflective particle in the matrix may be in a range of 5 to 80 wt %. When the total content of the particles in the matrix exceeds 80 wt %, the mechanical properties of the composite may be considerably degraded.

The electromagnetic interference shielding composite according to the present disclosure may include a further composite layer as well as a first composite layer. Specifically, the electromagnetic interference shielding composite according to the present disclosure may include a first composite layer composed of a first matrix, and reflective particles and first absorbent particles dispersed in the matrix, wherein the reflective particles reflect electromagnetic waves, wherein the first absorbent particles absorb the electromagnetic waves and convert the absorbed electromagnetic waves to heat energy and emit the heat energy, and a second composite layer adjacent to the first composite layer, wherein the second composite layer is composed of a second matrix, and second absorbent particles dispersed in the matrix, wherein the second absorbent particles absorb the electromagnetic waves and convert the absorbed electromagnetic waves to heat energy and emit the heat energy.

When the composite further includes the second composite layer in which the second absorbent particles are dispersed in the second matrix, greater electromagnetic interference shielding performance may be achieved, compared to the electromagnetic interference shielding composite including only a single-layer composite layer. The double-layer composite composed of the first composite layer and the second composite layer may exhibit an improved electromagnetic wave absorbing effect due to the presence of the second absorbent particles, compared to the case when only the single-layer as the first composite layer is included in the composite. In particular, the double-layer composite may implement the frequency selective absorption. That is, the double-layer composite may increase the electromagnetic wave absorbing effect at the specific frequency and the absorption selectivity a according to the frequency.

The electronic device according to the present disclosure includes an electronic element and the electromagnetic interference shielding composite covering a surface thereof. The electromagnetic interference shielding composite may include a composite layer composed of a matrix, and reflective particles and first absorbent particles dispersed in the matrix, wherein the reflective particles reflect electromagnetic waves, wherein the absorbent particles absorb the electromagnetic waves and convert the absorbed electromagnetic waves to heat energy and emit the heat energy.

Further, the electronic device according to the present disclosure includes an electronic element and the electromagnetic interference shielding composite covering a surface thereof, wherein the electromagnetic interference shielding composite may include a first composite layer composed of a first matrix, and reflective particles and first absorbent particles dispersed in the matrix, wherein the reflective particles reflect electromagnetic waves, wherein the first absorbent particles absorb the electromagnetic waves and convert the absorbed electromagnetic waves to heat energy and emit the heat energy, and a second composite layer adjacent to the first composite layer, wherein the second composite layer is composed of a second matrix, and second absorbent particles dispersed in the matrix, wherein the second absorbent particles absorb the electromagnetic waves and convert the absorbed electromagnetic waves to heat energy and emit the heat energy.

In the second composite layer, a content of the second absorbent particles may be in a range of 5 to 80 wt %. As in the first composite layer, in the second composite layer, the second absorbent particle according to the present disclosure may have a size of 100 nm to 100 µm in order to control the transmission and shielding of the selective electromagnetic wave. Preferably, the second absorbent particle may have a size of 200 nm to 20 µm. In one implementation of the present disclosure, 200 nm-sized absorbent particles may be contained in the second composite layer.

In one implementation, the electromagnetic interference shielding composite may be formed using a spray process. Thus, the first composite layer and the second composite layer may be formed on the surface of a 3D structure having a complex shape. The formation process of the composite layer may vary depending on a type of the matrix. For example, when the matrix is made of epoxy, a curing process using a curing agent may be used. When the matrix is made of the waterborne polyurethane, a drying process in which water is evaporated may be used. In one implementation of the present disclosure, the waterborne polyurethane may be used as the matrix, and the first composite layer may be formed via a spray process and a room temperature drying process.

The electronic device according to the present disclosure is characterized by including the electromagnetic interference shielding composite including the absorbent and reflective particles to selectively shield the electromagnetic wave. The electronic device may be, for example, 5G communication devices, automotive parts, military stealth fighters, and the like.

According to the present disclosure, the composite may selectively transmit therethrough the electromagnetic waves using the absorbent and reflective particles, and at the same time, selectively absorb and thus shield the electromagnetic waves that cause interferences, thereby achieving breakthrough technological advances in the electronic and communication fields.

Hereinafter, an electromagnetic interference shielding composite according to the present disclosure and an electronic device using the same will be described in more detail based on specific Present Examples and Comparative Examples. However, the Present Examples of the present disclosure are merely some embodiments of the present disclosure, and the scope of the present disclosure is not limited to the following Present Examples.

Present Example 1

① Preparation of Polymer Core Particles

Polymer particles used as cores were synthesized using waterborne polymerization. 110 mL of ultrapure water, 20 mL of styrene, and an appropriate amount of acrylate-based co-monomer were added to a flask and stirred therein to prepare a mixed solution. Then, the solution was heated to about 55° C., and then a metal sulfide initiator was added to the solution to initiate polymerization. After the reaction was carried out at a temperature of about 75° C. for 6 hours, a solution temperature was lowered to room temperature to prepare stable polymer particles. The prepared polymer particles had a strong negative charge due to influence of the initiator and the co-monomer.

② Preparation of Absorbent Particles

A polymer core particle solution was prepared by controlling a polymer core particles 1 wt % aqueous solution to pH 4 and stirring and uniformly dispersing the solution. Then, a graphene 0.5 wt % aqueous solution was controlled to pH 4, and then slowly added to the polymer core particle solution which was being stirred. The graphene used in this present example was reduced via p-phenylenediamine and thus exhibited a positive charge at pH 4. The negatively charged polymer core and the positively charged graphene were coupled to each other via electrostatic attraction in the solution to produce absorbent particles. After precipitation for 3 hours or more, a clear solution as a top layer was removed away, and the precipitated absorbent particle dispersed solution was freeze-dried to collect the absorbent particles.

③ Preparation of Electromagnetic Interference Shielding Composite 60 wt % of reflective particles and 10 wt % of the absorbent particles were dispersed in epoxy using a Thinky Mixer. In Present Example 1, commercially available nickel (Ni) core-shell particles were used as the reflective particles. A paste in which frequency-selective particles were dispersed was put into a 1 mm-thick mold, and then a pressure of 7 psi was applied to the mold using a hydraulic press at about 100° C. for 30 minutes. Then, the temperature was gradually lowered to room temperature, and the electromagnetic wave absorbent epoxy composite was collected. Hereinafter, the prepared composite material is referred to as Ni60/G10 epoxy composite.

FIGS. 3 and 4 are images taken by SEM (scanning electron microscope) of the absorbent particles and the reflective particles prepared in Present Example 1 of the present disclosure, respectively.

Referring to FIGS. 3 and 4, it may be identified that each of the prepared absorbent and reflective particles has a perfect spherical shape, and the prepared absorbent and reflective particles are evenly distributed while having a very uniform size.

Experimental Example 1

Analysis of Electromagnetic Interference Shielding Effect of Present Example 1

In order to investigate the electromagnetic interference shielding effect of the prepared Ni60/G10 epoxy composite as prepared according to Present Example 1 of the present disclosure, the electromagnetic wave shielding effectiveness (SE) according to the X-band frequency was measured. The results are shown in FIG. 5.

Referring to FIG. 5, it may be seen that the Ni60/G10 epoxy composite has a remarkably high shielding effect at the X-band frequency. Further, it may be identified that the electromagnetic wave absorbing effectiveness $SE_A$ is higher, compared to the electromagnetic wave reflection effectiveness $SE_R$. Thus, it may be seen that the selective electromagnetic interference shielding composite according to the present disclosure may achieve the electromagnetic interference shielding via absorption.

Present Example 2

An electromagnetic wave absorbent epoxy composite was prepared in the same manner as in the Present Example 1 except that the contents of the particles were adjusted to 50 wt % of reflective particles and 20 wt % of absorbent particles instead of 60 wt % of reflective particles and 10 wt % of absorbent particles in the electromagnetic wave absorbent epoxy composite producing method of the Present Example 1. Hereinafter, the thus produced composite is referred to as Ni50/G20 epoxy composite.

Present Example 3

An electromagnetic wave absorbent epoxy composite was prepared in the same manner as in the Present Example 1 except that the contents of the particles were adjusted to 40 wt % of reflective particles and 30 wt % of absorbent particles instead of 60 wt % of reflective particles and 10 wt % of absorbent particles in the electromagnetic wave absorbent epoxy composite producing method of the Present Example 1. Hereinafter, the thus produced composite is referred to as Ni40/G30 epoxy composite.

Present Example 4

An electromagnetic wave absorbent epoxy composite was prepared in the same manner as in the Present Example 1 except that the contents of the particles were adjusted to 30 wt % of reflective particles and 40 wt % of absorbent particles instead of 60 wt % of reflective particles and 10 wt % of absorbent particles in the electromagnetic wave absorbent epoxy composite producing method of the Present Example 1. Hereinafter, the thus produced composite is referred to as Ni30/G40 epoxy composite.

Present Example 5

An electromagnetic wave absorbent epoxy composite was prepared in the same manner as in the Present Example 1 except that the contents of the particles were adjusted to 20 wt % of reflective particles and 50 wt % of absorbent particles instead of 60 wt % of reflective particles and 10 wt % of absorbent particles in the electromagnetic wave absorbent epoxy composite producing method of the Present Example 1. Hereinafter, the thus produced composite is referred to as Ni20/G50 epoxy composite.

Present Example 6

An electromagnetic wave absorbent epoxy composite was prepared in the same manner as in the Present Example 1 except that the contents of the particles were adjusted to 10 wt % of reflective particles and 60 wt % of absorbent particles instead of 60 wt % of reflective particles and 10 wt % of absorbent particles in the electromagnetic wave absorbent epoxy composite producing method of the Present Example 1. Hereinafter, the thus produced composite is referred to as Ni10/G60 epoxy composite.

Experimental Example 2

Analysis of Electromagnetic Wave Absorptions of Present Examples 1 to 6

The electromagnetic wave absorption of each of the electromagnetic wave absorbent epoxy composites as prepared according to Present Examples 1 to 6 of the present disclosure was measured in the X-band frequency 8 to 12 GHz. The results are shown in FIG. 6.

Referring to FIG. 6, it may be identified that each of the prepared composite materials has an absorption smaller than 40%. Thus, it may be identified that selective electromagnetic wave absorption in the X-band frequency does not occur when a composite material having a thickness of about 1 mm is compose only of a single layer.

Present Example 7

An electromagnetic wave absorbent epoxy composite was prepared in the same manner as in the Present Example 1 except that the contents of the particles were adjusted to 70 wt % of absorbent particles and no amount of reflective particles, instead of 60 wt % of reflective particles and 10 wt % of absorbent particles in the electromagnetic wave absorbent epoxy composite producing method of the Present Example 1. Hereinafter, the thus produced composite is referred to as G70 epoxy composite.

Present Example 8

The Ni60/G10 epoxy composite obtained in Present Example 1 and the G70 epoxy composite obtained in Present Example 7 were stacked vertically to obtain a double-layered electromagnetic wave absorbent epoxy composite. Hereinafter, the thus produced composite is referred to as Ni60/G10+G70 double-layer epoxy composite.

Present Example 9

The Ni50/G20 epoxy composite obtained in the Present Example 2 and the G70 epoxy composite obtained in Present Example 7 were stacked vertically to obtain a double-layered electromagnetic wave absorbent epoxy composite. Hereinafter, the thus produced composite is referred to as Ni50/G20+G70 double-layer epoxy composite.

Present Example 10

The Ni40/G30 epoxy composite obtained in the Present Example 3 and the G70 epoxy composite obtained in Present Example 7 were stacked vertically to obtain a double-layered electromagnetic wave absorbent epoxy composite. Hereinafter, the thus produced composite is referred to as Ni40/G30+G70 double-layer epoxy composite.

Present Example 11

The Ni30/G40 epoxy composite obtained in the Present Example 4 and the G70 epoxy composite obtained in Present Example 7 were stacked vertically to obtain a double-layered electromagnetic wave absorbent epoxy composite. Hereinafter, the thus produced composite is referred to as Ni30/G40+G70 double-layer epoxy composite.

Present Example 12

The Ni20/G50 epoxy composite obtained in the Present Example 5 and the G70 epoxy composite obtained in Present Example 7 were stacked vertically to obtain a double-layered electromagnetic wave absorbent epoxy composite. Hereinafter, the thus produced composite is referred to as Ni20/G50+G70 double-layer epoxy composite.

Present Example 13

The Ni10/G60 epoxy composite obtained in the Present Example 6 and the G70 epoxy composite obtained in Present Example 7 were stacked vertically to obtain a double-layered electromagnetic wave absorbent epoxy composite. Hereinafter, the thus produced composite is referred to as Ni10/G60+G70 double-layer epoxy composite.

Experimental Example 3

Analysis of Electromagnetic Wave Absorption of Present Examples 8 and 10

The electromagnetic wave absorption of each of the Ni60/G10+G70 and Ni40/G30+G70 electromagnetic wave absorbent epoxy composites respectively prepared according to Present Examples 8 and 10 of the present disclosure was measured in the X-band frequency (8 to 12 GHz). The results are shown in FIG. 7.

Referring to FIG. 7, the Ni40/G30+G70 double layer epoxy composite exhibits the highest absorption at 9.6 GHz. The Ni60/G10+G70 double layer epoxy composite exhibits the highest absorption at 11.3 GHz. Thus, it may be identified that when using the double-layered epoxy composite prepared via the manner presented in the present disclosure, the composite selectively absorbs the electromagnetic waves in the X-band frequency.

Experimental Example 4

Frequency Selective Absorption Analysis of Present Examples 8 to 13

The selective absorbing characteristics to the frequency having a specific wavelength may be largely classified into two characteristics.

The first characteristic is the frequency band mainly absorbed by the composite material. For convenience of the description, a peak in a frequency band where the highest absorption occurs is defined as $f_{peak}$. The $f_{peak}$ value for each of the shielding materials may be adjusted to a value between 10 Hz to 77 GHz. Preferably, the $f_{peak}$ value for each of the shielding materials may be precisely adjusted to a value in a range of 3.42 to 3.70 Ghz, 26.5 to 28.9 GHz (5G communication frequency band), and 8 to 12 GHz (X-band in a military radar region).

The second characteristic is a percentage of an electromagnetic wave having a specific frequency as absorbed by each of the composite materials. The percentage may refer to the selectivity to the specific frequency. In this connection, an absorption selectivity and an absorption selectivity parameter may be defined as in following Equations 1 and 2.

$$\text{Absorption selectivity} = \frac{A}{A_{min}} \quad \text{[Equation 1]}$$

$$\text{Absorption selectivity parameter } \alpha = \frac{A_{max}}{A_{min}} \quad \text{[Equation 2]}$$

In the Equations 1 and 2, A means the proportion of absorption (or absorption fraction) to total amount of incident electromagnetic waves inside the composite material. $A_{min}$ and $A_{max}$ mean the minimum and maximum value of absorption fraction of the composite material, respectively.

The electromagnetic interference shielding composite according to the present disclosure has an absorption selectivity parameter α having a value of 1 or greater. Preferably, the electromagnetic interference shielding composite according to the present disclosure has an absorption selectivity parameter α having a value of 1 to 5.

The frequency $f_{peak}$ value mainly absorbed by each of the double-layer epoxy composites respectively prepared according to Present Examples 8 to 13 of the present disclosure, and the absorption selectivity parameter α of each thereof were derived and analyzed. The results are shown in FIG. 8.

Referring to FIG. 8, it may be seen that adjusting the contents of the reflective particles and the absorbent particles may allow adjusting the mainly absorbed frequency $f_{peak}$ and the selective absorption parameter α in the corresponding frequency.

Present Example 14

Preparation of Electromagnetic Wave Absorbent Coating Solution and Spray Coating Thereof 40 wt % of reflective particles and 40 wt % of absorbent particles were dispersed in WPU (waterborne polyurethane). The mixture was sprayed on a glass plate of 20 cm×20 cm×1 cm using a spray gun. The coated mixture was dried at room temperature. Thus, a coating layer capable of absorbing electromagnetic waves was formed on a surface of the glass plate. FIG. 9 shows a producing process and a prepared result according to the Present Example 14.

Referring to FIG. 9, it may be seen that a uniform coating layer may be formed on an object using the spray coating process according to a Present Example of the present disclosure, and may exhibit an electromagnetic interference shielding function.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. An electromagnetic interference shielding composite comprising a first composite layer, the first composite layer comprising:
   a matrix; and
   reflective particles and absorbent particles dispersed in the matrix,
   wherein a size of each of the absorbent particles and the reflective particles ranges from 200 nm to 20 µm, and the size of each absorbent particle is smaller than that of each reflective particle,
   wherein the reflective particles reflect an electromagnetic wave, and
   wherein the absorbent particles absorb the electromagnetic wave and convert the absorbed electromagnetic wave into thermal energy which is emitted.

2. The electromagnetic interference shielding composite of claim 1,
   wherein a weight ratio of the absorbent particles to the reflective particles in the first composite layer is greater than 10:0 and less than or equal to 1:9.

3. The electromagnetic interference shielding composite of claim 1,
   wherein the reflective particles include at least one selected from a group consisting of aluminum, copper, gold, silver, nickel, and MXene comprising $Ti_3C_2$ or $Ti_3CN$.

4. The electromagnetic interference shielding composite of claim 1,
   wherein the absorbent particles include one selected from a group consisting of a carbon-based material and a ferrite-based material.

5. The electromagnetic interference shielding composite of claim 4,
   wherein the carbon-based material includes one selected from a group consisting of graphene, carbon nanotube, carbon fiber, carbon black, and graphite.

6. The electromagnetic interference shielding composite of claim 4,
   wherein the ferrite-based material includes one selected from a group consisting of manganese ferrite, nickel-zinc ferrite, strontium ferrite, barium ferrite, and cobalt ferrite.

7. The electromagnetic interference shielding composite of claim 1,
   wherein a size of each of the absorbent particles ranges from 200 nm to 10 µm, and a size of each of the reflective particles ranges from 5 µm to 20 µm.

8. The electromagnetic interference shielding composite of claim 1,
   wherein the absorbent particles have a core-shell structure including a core particle and a shell layer that covers the core particle and is made of a carbon-based material or a ferrite-based material,
   wherein the core particle is made of a polymer or inorganic material,
   wherein the polymer includes a material selected from a group consisting of styrene based polymer, methacrylate based polymer, acrylate based polymer, vinyl based polymer, acrylonitrile based polymer, and combinations thereof, and
   wherein the inorganic material includes a material selected from a group consisting of silicon dioxide, cerium oxide, titanium dioxide, boron nitride, and aluminum nitride.

9. The electromagnetic interference shielding composite of claim 1,
   wherein the reflective particles have a core-shell structure including a core particle and a shell layer that covers the core particle and is made of one selected from a group consisting of aluminum, copper, gold, silver, nickel, and MXene, and
   wherein the core particle is made of a polymer or inorganic material,
   wherein the polymer includes a material selected from a group consisting of styrene based polymer, methacrylate based polymer, acrylate based polymer, vinyl based polymer, acrylonitrile based polymer, and combinations thereof, and
   wherein the inorganic material may include a material selected from a group consisting of silicon dioxide, cerium oxide, titanium dioxide, boron nitride and aluminum nitride.

10. The electromagnetic interference shielding composite of claim 1,
    wherein a total content of the absorbent particles and the reflective particles in the matrix ranges from 5 to 80 wt %.

11. An electromagnetic interference shielding composite comprising:
    a first composite layer and a second composite layer adjacent to the first composite layer,
    wherein the first composite layer includes:
    a first matrix; and
    reflective particles and first absorbent particles dispersed in the first matrix,
    wherein the reflective particles reflect an electromagnetic wave,
    wherein a size of each of the first absorbent particles and the reflective particles ranges from 200 nm to 20 µm, and the size of each absorbent particle is smaller than that of each reflective particle,
    wherein the first absorbent particles absorb the electromagnetic wave and convert the absorbed electromagnetic wave into thermal energy which is emitted;
    wherein the second composite layer includes:
    a second matrix; and
    second absorbent particles dispersed in the second matrix, and wherein the second absorbent particles absorb the electromagnetic wave and convert the absorbed electromagnetic wave into thermal energy which is emitted.

12. The electromagnetic interference shielding composite of claim 11,
wherein the reflective particles include at least one selected from a group consisting of aluminum, copper, gold, silver, nickel, and MXene.

13. The electromagnetic interference shielding composite of claim 11,
wherein each of the first and second absorbent particles includes one selected from a group consisting of a carbon-based material and a ferrite-based material.

14. The electromagnetic interference shielding composite of claim 11,
wherein each of the first and second absorbent particles has a core-shell structure including a polymer core particle and a shell layer that covers the core particle and is made of a carbon-based material or a ferrite-based material.

15. The electromagnetic interference shielding composite of claim 11,
wherein the reflective particles have a core-shell structure including a polymer core particle and a shell layer that covers the core particle and is made of one selected from a group consisting of aluminum, copper, gold, silver, nickel, and MXene.

16. An electronic device, comprising:
an electronic element; and
an electromagnetic interference shielding composite covering a surface of the electronic element,
wherein the electromagnetic interference shielding composite includes a first composite layer, the first composite layer comprising:
a matrix; and
reflective particles and absorbent particles dispersed in the matrix,
wherein a size of each of the absorbent particles and the reflective particles ranges from 200 nm to 20 μm, and the size of each absorbent particle is smaller than that of each reflective particle,
wherein the reflective particles reflect an electromagnetic wave, and
wherein the absorbent particles absorb the electromagnetic wave and convert the absorbed electromagnetic wave into thermal energy which is emitted.

17. An electronic device, comprising:
an electronic element; and
an electromagnetic interference shielding composite covering a surface of the electronic element,
wherein the electromagnetic interference shielding composite includes:
a first composite layer and a second composite layer adjacent to the first composite layer,
wherein the first composite layer includes:
a first matrix; and
reflective particles and first absorbent particles dispersed in the first matrix,
wherein a size of each of the first absorbent particles and the reflective particles ranges from 200 nm to 20 μm, and the size of each absorbent particle is smaller than that of each reflective particle,
wherein the reflective particles reflect an electromagnetic wave,
wherein the first absorbent particles absorb the electromagnetic wave, convert the absorbed electromagnetic wave into thermal energy which is emitted;
wherein the second composite layer includes:
a second matrix; and
second absorbent particles dispersed in the second matrix, and
wherein the second absorbent particles absorb the electromagnetic wave and convert the absorbed electromagnetic wave into thermal energy which is emitted.

* * * * *